(12) United States Patent
Adachi et al.

(10) Patent No.: US 8,853,610 B2
(45) Date of Patent: Oct. 7, 2014

(54) IMAGING DEVICE

(75) Inventors: Yudai Adachi, Kanagawa (JP); Tetsuya Iizuka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/609,366

(22) Filed: Sep. 11, 2012

(65) Prior Publication Data

US 2013/0161486 A1 Jun. 27, 2013

(30) Foreign Application Priority Data

Sep. 26, 2011 (JP) ................... 2011-209102

(51) Int. Cl.
*H01L 27/146* (2006.01)
(52) U.S. Cl.
CPC ...... *H01L 27/14643* (2013.01); *H01L 27/1461* (2013.01); *H01L 27/14605* (2013.01); *H01L 27/14623* (2013.01)
USPC .................................................. 250/208.1
(58) Field of Classification Search
CPC .................. H01L 127/14643; H01L 31/18
USPC ...................... 250/208.1, 201.2; 257/290–292
See application file for complete search history.

(56) References Cited

U.S. PATENT DOCUMENTS

| | | | | |
|---|---|---|---|---|
| 2011/0069213 A1* | 3/2011 | Aoki | ............................ | 348/302 |
| 2011/0080508 A1* | 4/2011 | Katsuno et al. | ............... | 348/302 |
| 2012/0001080 A1* | 1/2012 | Okada | ........................... | 250/366 |
| 2012/0012961 A1* | 1/2012 | Kataoka et al. | ............... | 257/432 |

FOREIGN PATENT DOCUMENTS

| | | |
|---|---|---|
| JP | 2000-292686 | 10/2000 |
| JP | 2009-105358 | 5/2009 |

\* cited by examiner

*Primary Examiner* — Seung C Sohn
(74) *Attorney, Agent, or Firm* — Dentons US LLP

(57) ABSTRACT

An imaging device includes: a plurality of first pixels, each including a photodiode and in-pixel transistors and having a light-blocking metal film blocking part of light entering the respective first pixels; and a plurality of second pixels, each including a photodiode and in-pixel transistors and having no light-blocking metal film; and each of the photodiodes included in the first pixels or the second pixels is surrounded with a metal frame.

5 Claims, 7 Drawing Sheets

IMAGING DEVICE

BACKGROUND

The present technology relates to imaging devices and, in particular, to imaging devices to be designed with a high degree of freedom at low cost without impairing accuracy of focus detection, image quality, and the like.

In the past, imaging devices have been proposed that include pixels outputting imaging signals (hereinafter referred to as normal pixels) and pixels detecting a focal length (hereinafter referred to as AF (auto focus) pixels) both formed on one chip (see, for example, Japanese Unexamined Patent Application Publication No. 2000-292686).

According to the technique disclosed in Japanese Unexamined Patent Application Publication No. 2000-292686, pupil-division microlenses and pairs of light-receiving elements that receive pupil division light etc. are formed in a plurality of regions on the chip of the imaging device, and focus detection is performed based on the output of the light-receiving elements. This makes it possible to provide a wider focus detection region while saving space without adding, for example, a new mechanism or an optical system, increase an AF speed, and perform accurate focusing.

Moreover, to increase the accuracy of focus detection, it is necessary for AF pixels to be irradiated with incident light from a constant direction. It is for this reason that adopting a configuration in which a light-blocking film is provided over part of the AF pixel, for example, has been proposed (for example, Japanese Unexamined Patent Application Publication No. 2009-105358).

According to the technique of Japanese Unexamined Patent Application Publication No. 2009-105358, a light-blocking film with an opening is disposed over an AF pixel from which light enters, and the opening defines a region through which the incident light enters a photoelectric conversion section. As a result, the photoelectric conversion section of the AF pixel selectively receives the luminous flux coming through a region in an exit pupil of a taking lens, the region that is substantially eccentric from the center of the exit pupil in -Y direction, and performs photoelectric conversion.

SUMMARY

However, when the light-blocking film is disposed over part of the AF pixel, an electric capacitance of the AF pixel, that is, conversion efficiency of the AF pixel may change depending on the position where the light-blocking film is disposed or the shape of the light-blocking film. That is, a difference in electrical characteristics arises among individual AF pixels.

Moreover, in the imaging device, the electrical characteristics of a normal pixel located next to an AF pixel may change due to the influence of the light-blocking film disposed over the AF pixel. That is, a difference in electrical characteristics arises between the normal pixel located next to an AF pixel and another normal pixel that is not located next to an AF pixel.

As a result, the difference in electrical characteristics among the AF pixels may cause variation in output signals used for detecting focus length, resulting in reduction in accuracy of focus detection. Moreover, a difference in electrical characteristics among the normal pixels may create a difference in output signals used for imaging, resulting in significant reduction in quality of images.

Furthermore, in the existing techniques, as described above, since the electrical characteristics of a normal pixel located next to an AF pixel may change depending on the existence of the AF pixel, the AF pixels are not freely placed in an array of pixels.

It is desirable to provide an imaging device to be designed with a high degree of freedom at low cost without impairing accuracy of focus detection, image quality, and the like.

According to an embodiment of the present disclosure, there is provided an imaging device including: a plurality of first pixels, each including a photodiode and in-pixel transistors and having a light-blocking metal film blocking part of light entering the respective first pixels; and a plurality of second pixels, each including a photodiode and in-pixel transistors and having no light-blocking metal film. Each of the photodiodes included in the first pixels or the second pixels is surrounded with a metal frame.

The plurality of first pixels and the plurality of second pixels may be disposed in such a way that, in each of the plurality of first pixels and the plurality of second pixels, the distance between part of a wiring line connected to a terminal of one of the in-pixel transistors and the metal frame of an adjacent pixel becomes constant.

The plurality of first pixels and the plurality of second pixels may be disposed in such a way that, in each of the plurality of first pixels and the plurality of second pixels, the distance between a wiring line connecting a gate terminal of one of the in-pixel transistors, which converts electric charges into a voltage signal, and an FD (floating diffusion) in a circuit and the metal frame in an adjacent pixel becomes constant.

The light-blocking metal film and the metal frame may be made of a same metal film forming a wiring line connecting predetermined terminals of the in-pixel transistors.

The first pixels may be configured to detect a focal length, and the second pixels may be configured to output an imaging signal.

According to the embodiment of the present disclosure, a plurality of first pixels, each including a photodiode and in-pixel transistors and having a light-blocking metal film blocking part of light entering the respective first pixels, and a plurality of second pixels, each including a photodiode and in-pixel transistors and having no light-blocking metal film, are provided, and each of the photodiodes included in the first pixels or the second pixels is surrounded with a metal frame.

According to the embodiment of the present disclosure, it is possible to provide an imaging device with a high degree of freedom at low cost without impairing accuracy of focus detection, image quality, and the like.

DETAILED DESCRIPTION OF EMBODIMENTS

Hereinafter, an embodiment of the present disclosure will be described with reference to the drawings.

First, a configuration of an imaging device will be described. In the past, an imaging device including pixels outputting imaging signals (hereinafter referred to as normal pixels) and pixels detecting a focal length (hereinafter referred to as AF (auto focus) pixels) has been proposed.

Figure 1:
FIG. 1 is a diagram illustrating a configuration of an imaging device having normal pixels and AF pixels.

FIG. 1 is a diagram illustrating a configuration of an imaging device including normal pixels and AF pixels. As illustrated in FIG. 1, in an imaging device 10, a line of normal pixels, each being represented as a rectangle in which "N" is written in FIG. 1, and a line of AF pixels, each being represented as a rectangle in which "AF" is written in FIG. 1, are placed alternately.

Figure 2:
FIG. 2 is a diagram illustrating another configuration of the imaging device having normal pixels and AF pixels.

Moreover, in another example, the normal pixels and the AF pixels may be arranged as shown in FIG. 2. In an imaging device 20 illustrated in FIG. 2, after one line of AF pixels is placed, two lines of normal pixels are placed.

Furthermore, there is an imaging device in which, after one line of AF pixels, three, four, or more lines of normal pixels are placed. In addition, it is possible to adopt a configuration in which, after one line of normal pixels, two, three, or more lines of AF pixels are placed.

Figure 3:
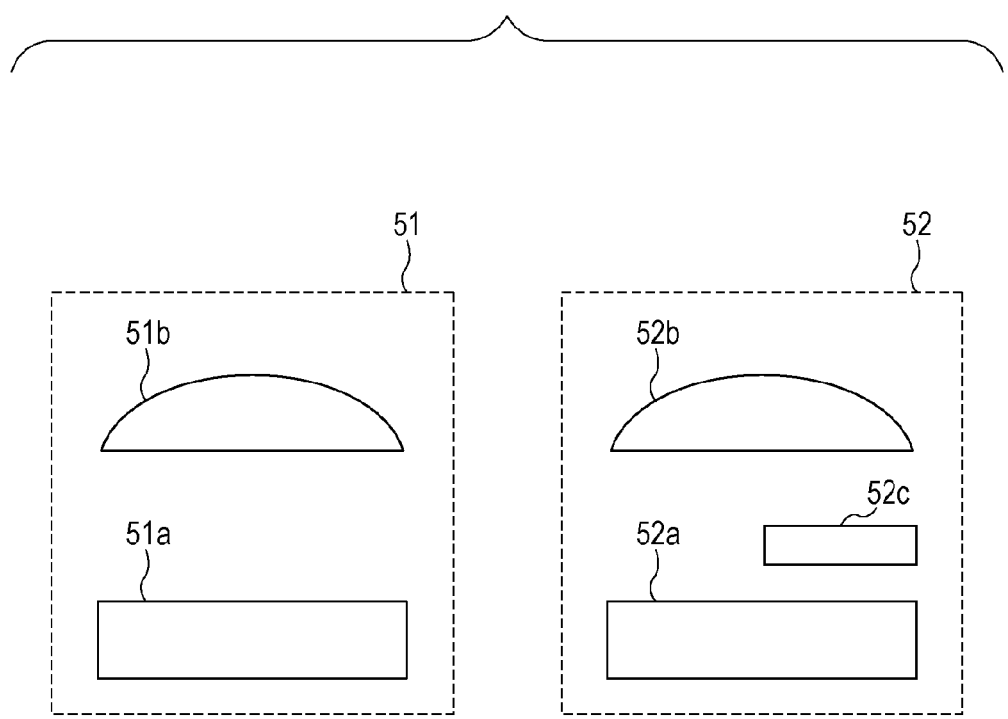
FIG. 3 is a diagram illustrating a configuration of a normal pixel and a configuration of an AF pixel.

FIG. 3 is a diagram illustrating a configuration of a normal pixel and a configuration of an AF pixel.

On the left part of FIG. 3, a normal pixel 51 is illustrated. As shown in this drawing, the normal pixel 51 is formed of a photodiode 51a and an on-chip lens 51b. In this drawing, an upper side of the drawing is assumed to be a light-receiving surface of the photodiode, and the photodiode is configured to produce electric current corresponding to the intensity of incident light entering the light-receiving surface. Moreover, a color filter etc. is provided on the light-receiving surface of the photodiode 51a when necessary.

On the right part of FIG. 3, an AF pixel 52 is illustrated. As shown in this drawing, the AF pixel 52 includes a photodiode 52a, an on-chip lens 52b, and a light-blocking film 52c. In this drawing, an upper side of the drawing is assumed to be a light-receiving surface of the photodiode, and the photodiode is configured to produce electric current corresponding to the intensity of incident light entering the light-receiving surface. Moreover, a color filter etc. is provided on the light-receiving surface of the photodiode 52a when necessary.

To increase the accuracy in focus detection, it is necessary for an AF pixel to be irradiated with incident light from a constant direction. It is for this reason that the light-blocking film 52c is provided over the AF pixel 52. The light-blocking film 52c is provided in such a way as to block light entering the light-receiving surface of the photodiode 52a in a particular direction. As an example of the light-blocking film 52c, a copper film, which also forms a wiring pattern on a circuit board, may be used. By doing so, the light-blocking film is simultaneously patterned at a patterning process of wiring lines formed for a driving circuit and the like. This makes it possible to produce the imaging device including normal pixels and AF pixels without adding a special production process.

Incidentally, the configurations illustrated in FIG. 3 are schematic configurations. In actual normal pixels and AF pixels, an in-pixel transistor and the like are also provided.

Next, with reference to FIGS. 4A to 6B, the detailed configuration of an existing normal pixel or AF pixel will be described.

Figure 4A:
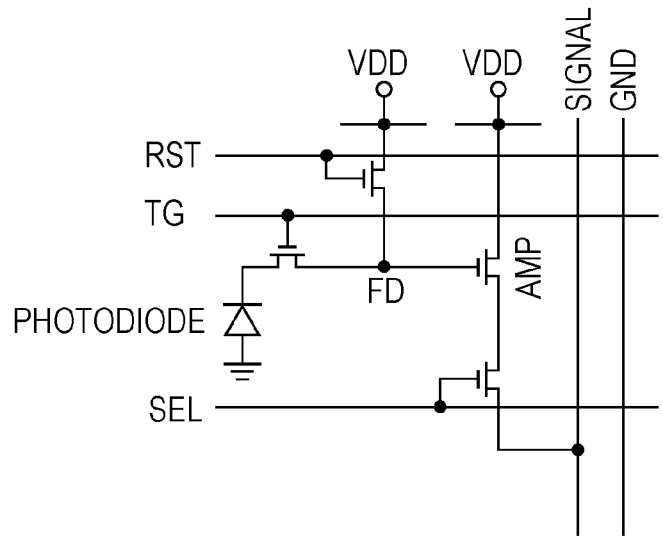
FIGS. 4A and 4B are diagrams illustrating a circuit configuration of a normal pixel.
Figure 4B:
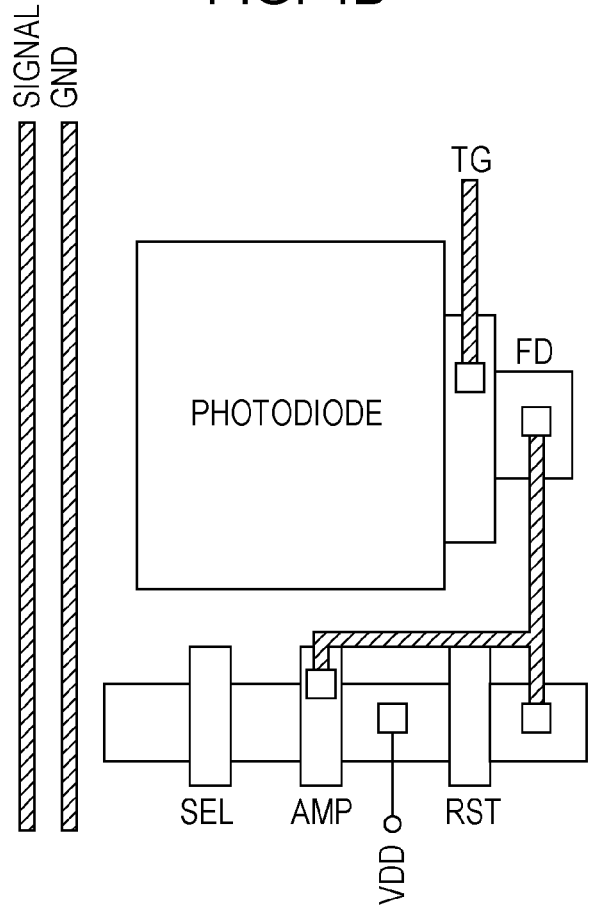

FIGS. 4A and 4B are diagrams illustrating the circuit configuration of the normal pixel. FIG. 4A is a circuit diagram of the normal pixel, and FIG. 4B is the circuit layout of the normal pixel. FIGS. 4A and 4B each illustrate the circuit configuration of a normal pixel forming the imaging device.

As illustrated in FIG. 4A, four in-pixel transistors are provided in this circuit. A transmission transistor connected to a TG (transmission gate) line transmits charges accumulated in a photodiode to FD (floating diffusion). Moreover, a reset transistor connected to an RST line is provided. Furthermore, a conversion transistor for converting the charges in the FD into a voltage signal is provided. In addition, in this circuit, a selection transistor connected to an SEL line is provided.

FIG. 4B illustrates a configuration of MT1 when the normal pixel is formed of two stages (MT1 and MT2). As illustrated in FIG. 4B, a conversion transistor (AMP) is disposed on the lower side of the photodiode in FIG. 4B. The gate terminal of the AMP is connected to the FD by the wiring line extending downward from the FD in FIG. 4B.

Figure 5A:
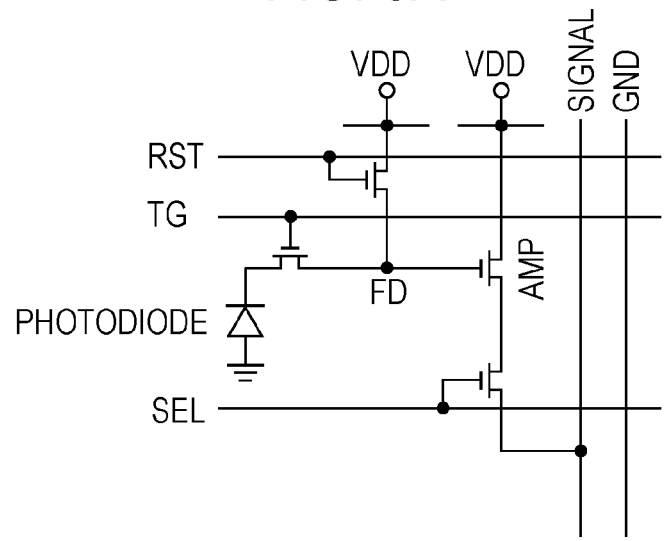
FIGS. 5A and 5B are diagrams illustrating the circuit configuration of the normal pixel.
Figure 5B:
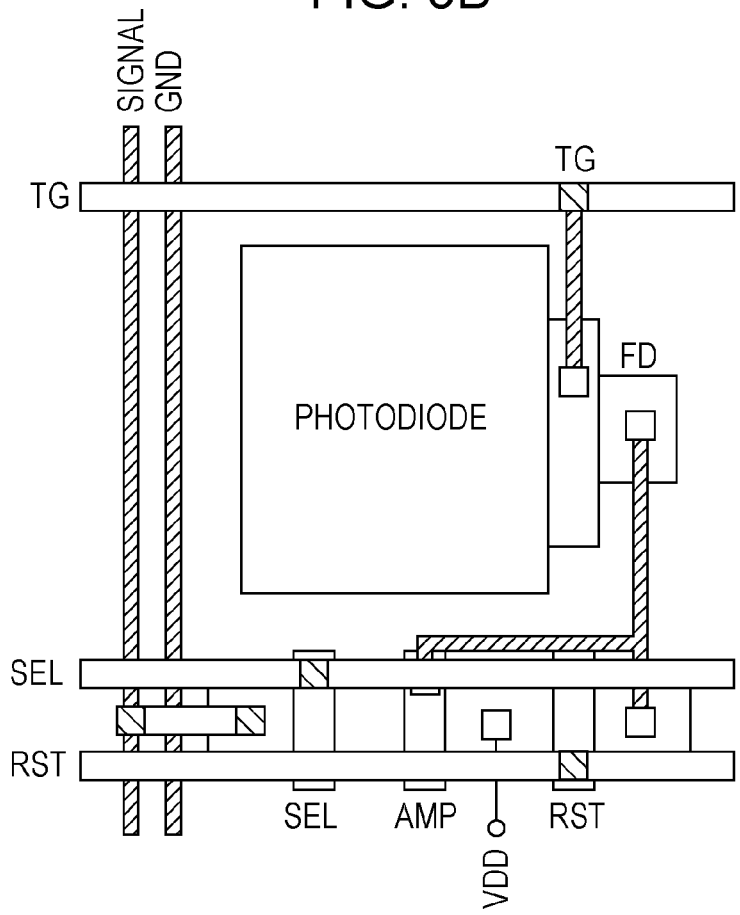

FIGS. 5A and 5B are diagrams illustrating the circuit configuration of the normal pixel. FIG. 5A is a circuit diagram of the normal pixel, and FIG. 5B is the circuit layout of the normal pixel. FIG. 5B illustrates a configuration of MT1 and MT2 when the normal pixel is formed of two stages (MT1 and MT2). In FIG. 5B, in addition to those illustrated in FIG. 4B, the TG line, the SEL line, and the RST line are provided.

FIGS. 5A and 5B each illustrate the circuit configuration of a normal pixel forming the imaging device.

Figure 6A:
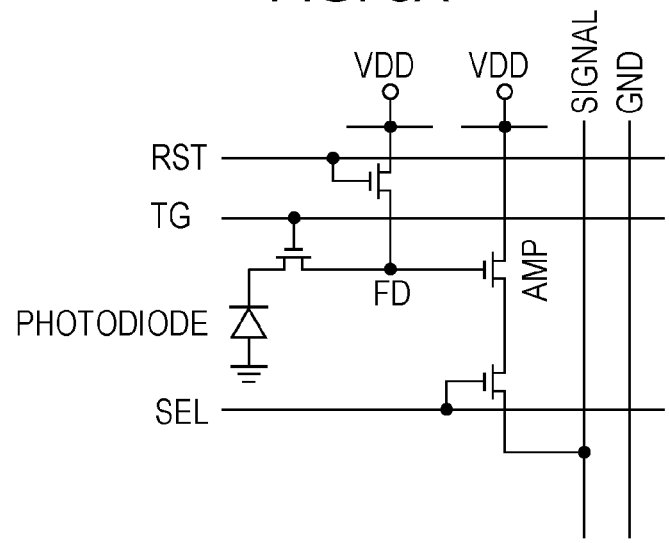
FIGS. 6A and 6B are diagrams illustrating the circuit configuration of an AF pixel.
Figure 6B:
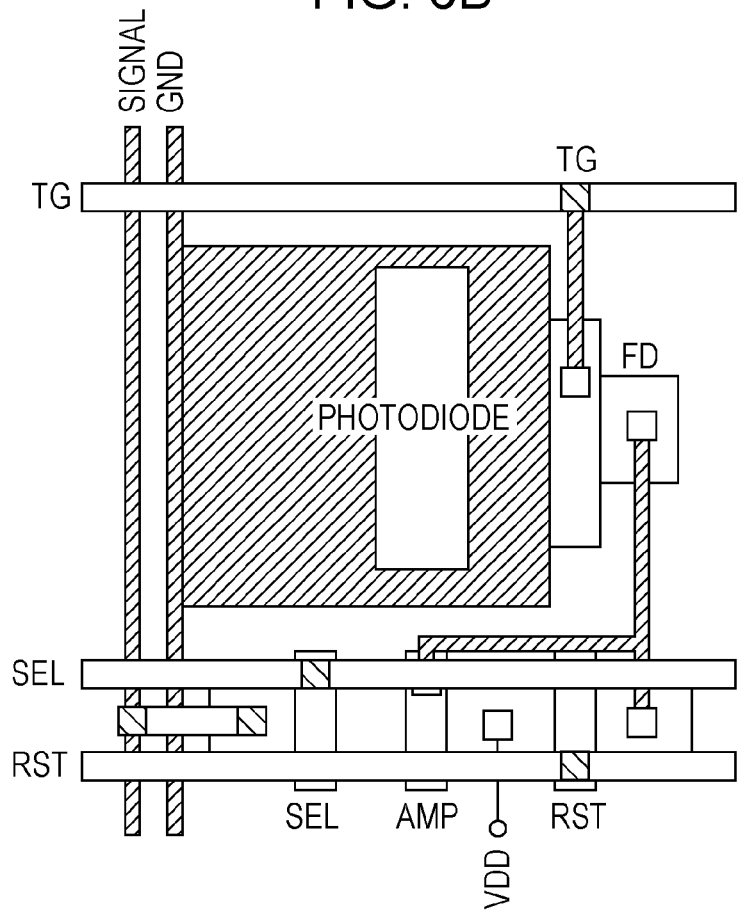

FIGS. 6A and 6B are diagrams illustrating the circuit configuration of the AF pixel. FIG. 6A is a circuit diagram of the AF pixel, and FIG. 6B is the circuit layout of the AF pixel. The circuit diagram of the AF pixel is the same as the circuit diagram of the normal pixel. FIG. 6B illustrates a configuration of MT1 and MT2 when the AF pixel is formed of two stages (MT1 and MT2). As illustrated in FIG. 6B, in the AF pixel, the light-blocking film is provided over the photodiode. The light-blocking film is formed with a GND pattern in one body. The other portions of FIG. 6B are similar to those of the normal pixel in FIG. 5B.

FIGS. 6A and 6B each illustrate the circuit configuration of an AF pixel forming the imaging device.

The electric capacitance of the FD illustrated in FIGS. 4A to 6B is affected by the metal that is present near the wiring line extending downward from the FD in the drawings. When the electric capacitance of the FD changes, the conversion efficiency of the conversion transistor (AMP) also changes. In general, when metal is present near the wiring line extending downward from the FD as illustrated in the drawing, the conversion efficiency of the conversion transistor is reduced. That is, the electrical characteristics of the pixel change depending on the existence of the metal near the pixel, and, when a difference in electrical characteristics arises among the circuits forming the pixel, and a difference in conversion efficiency arises among the pixels.

Figure 7:
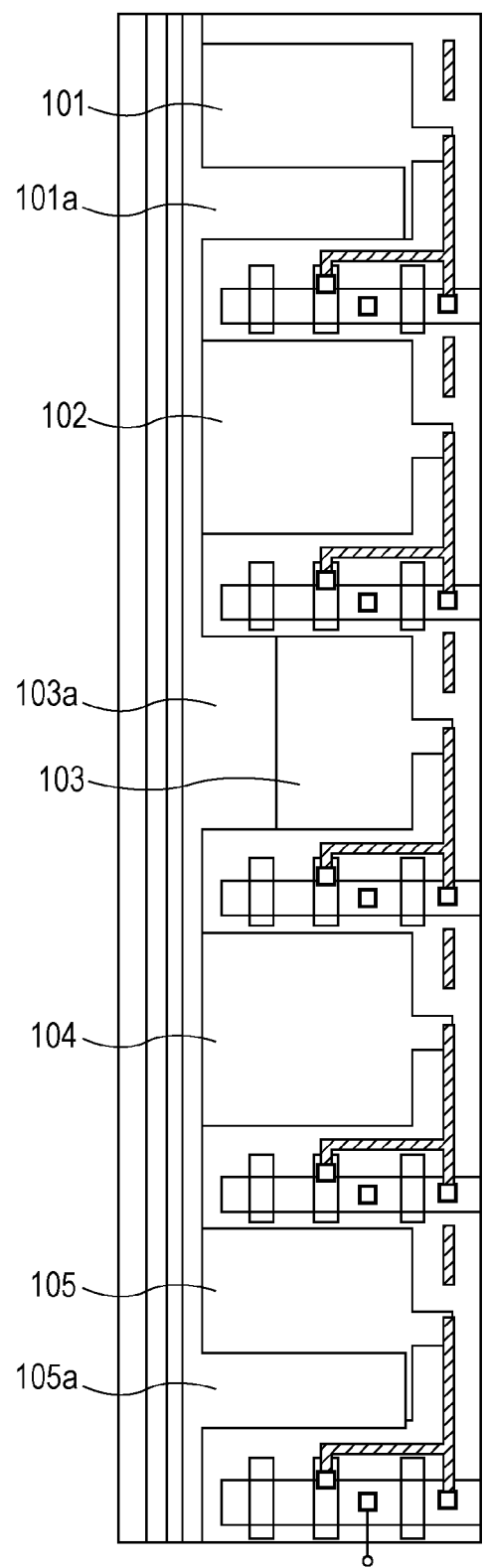
FIG. 7 is a diagram illustrating a circuit layout in an existing imaging device including normal pixels and AF pixels.

FIG. 7 is a diagram illustrating a circuit layout in an existing imaging device including normal pixels and AF pixels. In FIG. 7, pixels 101 to 105 are placed in line in a longitudinal direction. Only part of the imaging device is illustrated in FIG. 7, but actually, more pixels are provided.

The pixels 101, 103, and 105 in FIG. 7 are AF pixels and have light-blocking films 101a, 103a, and 105a, respectively. The pixels 102 and 104 are normal pixels and do not have a light-blocking film.

Incidentally, it is assumed that the circuit of each pixel in FIG. 7 has a layout similar to the circuit layout described above with reference to FIG. 5B or FIG. 6B. That is, each of the pixels 101 to 105 has a layout similar to the circuit layout described above with reference to FIG. 5B or FIG. 6B.

As described earlier, when metal is present near the wiring line extending downward in the drawing from the FD in the circuit of the pixel (the wiring line connecting the FD and the gate terminal of the AMP), the conversion efficiency of the conversion transistor is reduced. Below the pixel 102 in FIG. 7, the pixel 103 which is an AF pixel is present. Since the wiring line connecting the FD and the gate terminal of the AMP of the pixel 102 is near the light-blocking film 103a of the pixel 103, the conversion efficiency of the AMP of the pixel 102 is relatively low.

On the other hand, below the pixel 104 in FIG. 7, the pixel 105 which is an AF pixel is also present. However, since the wiring line connecting the FD and the gate terminal of the AMP of the pixel 104 is not near the light-blocking film 105a of the pixel 105, the conversion efficiency of the AMP of the pixel 104 is higher than that of the AMP of the pixel 102.

That is, since the light-blocking film 103a of the pixel 103 is formed on the left side of the photodiode, the light-blocking film 103a is near the wiring line connecting the FD and the gate terminal of the AMP of the pixel 102 disposed above the pixel 103. On the other hand, since the light-blocking film 105a of the pixel 105 is formed only on the lower side of the photodiode, the light-blocking film 105a is not so near the wiring line connecting the FD and the gate terminal of the AMP of the pixel 102 disposed above the pixel 103.

As described above, for example, the conversion efficiency of the normal pixel located next to the AF pixel changes depending on the shape of the light-blocking film of the AF pixel. In FIG. 7, a case in which a line of normal pixels and a line of AF pixels are placed alternately has been described. However, for example, in an imaging device with the configuration described above with reference to FIG. 2, a difference in conversion efficiency among the pixels becomes more pronounced.

Moreover, here, only a change in conversion efficiency of the normal pixel has been described. However, for example, the conversion efficiency of the AF pixel may also change depending on the shape of the light-blocking film of another AF pixel located next to the AF pixel.

As described above, in the existing imaging device, for example, a difference in output signal for focus detection may be caused by a difference in electrical characteristics among the AF pixels, resulting in a reduction in the accuracy in focus detection. Moreover, in the existing imaging device, for example, a difference in electrical characteristics among the normal pixels may create a difference in output signals for imaging, resulting in a significant reduction in quality of images.

Therefore, the embodiment of the present disclosure reduces a variation in electrical characteristics among the pixels. Specifically, the circuit of the pixel is formed in such a way that, for example, the photodiode is surrounded with a wiring line with a predetermined thickness (width).

Figure 8:
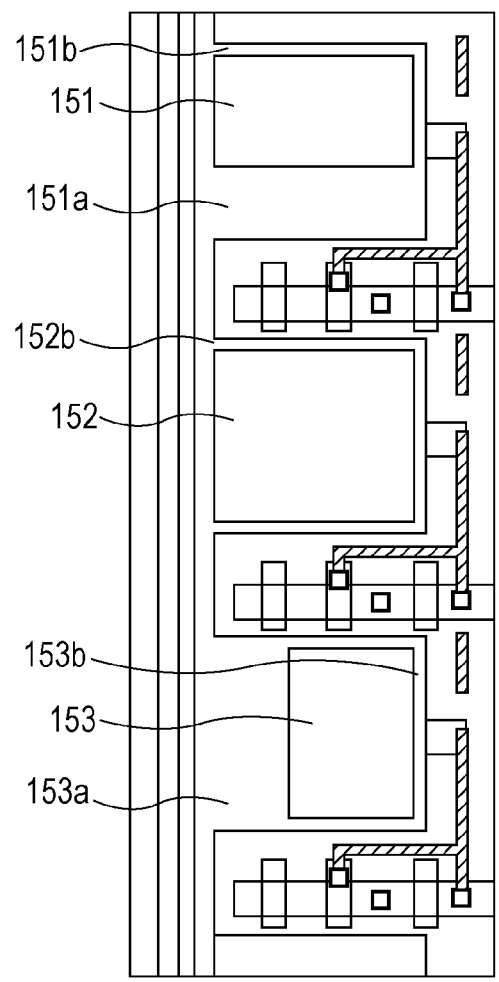
FIG. 8 is a diagram illustrating a circuit layout in an imaging device including a normal pixel and AF pixels when an embodiment of the present disclosure is used.

FIG. 8 is a diagram illustrating a circuit layout in an imaging device including a normal pixel and AF pixels when the embodiment of the present disclosure is used. In the example of FIG. 8, pixels 151 to 153 are placed in a line in a longitudinal direction. Only part of the imaging device is illustrated in FIG. 8, but actually, more pixels are provided.

The pixels 151 and 153 in FIG. 8 are AF pixels and have light-blocking films 151a and 153a, respectively. The pixel 152 is a normal pixel and does not have a light-blocking film.

Furthermore, in FIG. 8, the pixels 151 to 153 are provided with surrounding frames 151b to 153b, respectively, each being a wiring line surrounding the respective photodiodes and having a predetermined thickness (width).

That is, the wiring line having a thickness that does not reduce the area of the light-receiving surface of the photodiode greatly is provided in such a way as to surround the four sides of the rectangular photodiode. Incidentally, the surrounding frames 151b to 153b, which are circuits of the pixels 151 to 153, respectively, are formed with the respective GND patterns in one body. That is, parts of the surrounding frames are integrated with the respective light-blocking films.

When the configuration illustrated in FIG. 8 is adopted, the surrounding frame 152b of the pixel 152 is present near the wiring line connecting the FD and the gate terminal of the AMP of the pixel 151, for example. Moreover, the surrounding frame 153b of the pixel 153 is present near the wiring line connecting the FD and the gate terminal of the AMP of the pixel 152. This makes it possible to make constant the distance between the wiring line connecting the FD and the gate terminal of the AMP of each pixel and the metal near the wiring line and minimize a difference in electrical characteristics among the pixels.

That is, by using the embodiment of the present disclosure, it is possible to eliminate a difference in conversion efficiency among the pixels. This makes it possible to prevent, for example, reduction in accuracy of focus detection caused by variation in electrical characteristics among the AF pixels and reduction in image quality caused by variation in electrical characteristics among the normal pixels. Moreover, as described earlier, since the surrounding frames 151b to 153b, which are circuits of the pixels 151 to 153, respectively, are formed with the respective GND patterns in one body, it is not necessary to change the material for producing the circuit of the pixel and change the production process.

Therefore, by using the embodiment of the present disclosure, it may provide imaging devices to be designed with a high degree of freedom at low cost without impairing accuracy of focus detection, image quality, and the like.

It is to be understood that an embodiment of the present disclosure is not limited to the embodiment described above and various changes can be made therein without departing from the spirit of the present disclosure.

Incidentally, the embodiment of the present disclosure can adopt the following configuration.

(1)

An imaging device including: a plurality of first pixels, each including a photodiode and in-pixel transistors and having a light-blocking metal film blocking part of light entering the respective first pixels; and a plurality of second pixels, each including a photodiode and in-pixel transistors and having no light-blocking metal film; wherein each of the photodiodes included in the first pixels or the second pixels is surrounded with a metal frame.

(2)

The imaging device described in (1), wherein the plurality of first pixels and the plurality of second pixels are disposed in such a way that, in each of the plurality of first pixels and the plurality of second pixels, a distance between part of a wiring line connected to a terminal of one of the in-pixel transistors and a metal frame of an adjacent pixel becomes constant.

(3)

The imaging device described in (1) or (2), wherein the plurality of first pixels and the plurality of second pixels are disposed in such a way that, in each of the plurality of first pixels and the plurality of second pixels, a distance between a wiring line connecting a gate terminal of one of the in-pixel transistors, which converts electric charges into a voltage signal, and an FD (floating diffusion) terminal in a circuit and a metal frame in an adjacent pixel becomes constant.

(4)

The imaging device described in any one of (1) to (3), wherein the light-blocking metal film and the metal frame are made of a same metal film forming a wiring line connecting predetermined terminals of the in-pixel transistors.

(5)

The imaging device described in any one of (1) to (4), wherein the first pixels are configured to detect a focal length, and the second pixels are configured to output an imaging signal.

The present disclosure contains subject matter related to that disclosed in Japanese Priority Patent Application JP 2011-209102 filed in the Japan Patent Office on Sep. 26, 2011, the entire contents of which are hereby incorporated by reference.

What is claimed is:

1. An imaging device comprising:
   a plurality of first pixels, each including (i) a photodiode, (ii) in-pixel transistors, and (iii) a light-blocking metal film operable to partially block light entering the respective first pixels; and
   a plurality of second pixels, each including (i) a photodiode and (ii) in-pixel transistors, the plurality of second pixels having no light-blocking metal film,
   wherein,
   each of the photodiodes included in the first pixels or the second pixels is surrounded with a metal frame.

2. The imaging device according to claim 1, wherein
   in each of the plurality of first pixels and the plurality of second pixels, a distance between (i) part of a wiring line connected to a terminal of one of the in-pixel transistors, and (ii) a metal frame of an adjacent pixel is equal.

3. The imaging device according to claim 1, wherein
   in each of the plurality of first pixels and the plurality of second pixels, a distance between (i) a wiring line connecting (a) a gate terminal of one of the in-pixel transistors operable to convert electric charges into a voltage signal, and (b) a floating diffusion terminal in a circuit, and (ii) a metal frame in an adjacent pixel is equal.

4. The imaging device according to claim 1, wherein
   the light-blocking metal film and the metal frame (i) are made of a same metal film, and (ii) form a wiring line connecting predetermined terminals of the in-pixel transistors.

5. The imaging device according to claim 1, wherein
   the first pixels are configured to detect a focal length, and
   the second pixels are configured to output an imaging signal.

* * * * *